United States Patent
Sauer et al.

(10) Patent No.: US 10,176,100 B1
(45) Date of Patent: Jan. 8, 2019

(54) CACHE COHERENCY PROCESS

(71) Applicant: Cadence Design Systems, Inc., San Jose, CA (US)

(72) Inventors: Christian Sauer, Hosena (DE); Hans-Peter Loeb, San Carlos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 448 days.

(21) Appl. No.: 14/976,085

(22) Filed: Dec. 21, 2015

(51) Int. Cl.
  *G06F 17/50* (2006.01)
  *G06F 13/00* (2006.01)
  *G06F 12/0815* (2016.01)

(52) U.S. Cl.
  CPC ...... *G06F 12/0815* (2013.01); *G06F 17/5022* (2013.01); *G06F 17/505* (2013.01); *G06F 2212/1032* (2013.01); *G06F 2212/62* (2013.01)

(58) Field of Classification Search
  CPC ............... G06F 17/5022; G06F 17/505; G06F 12/0815; G06F 13/00; G06F 2212/1032; G06F 2212/62
  USPC .............. 716/106, 111, 136; 703/16, 17, 28; 711/113
  See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,475,830 A | 12/1995 | Chen et al. | |
| 5,551,013 A | 8/1996 | Beausoleil et al. | |
| 5,960,191 A | 9/1999 | Sample et al. | |
| 6,035,117 A | 3/2000 | Beausoleil et al. | |
| 6,051,030 A | 4/2000 | Beausoleil et al. | |
| 6,618,698 B1 | 9/2003 | Beausoleil et al. | |
| 7,362,074 B2 * | 4/2008 | Iwane | G01R 31/3662 320/132 |
| 8,793,628 B1 | 7/2014 | Varma | |
| 8,943,449 B1 | 1/2015 | Varma | |
| 9,685,807 B2 * | 6/2017 | Nakao | H02J 7/0057 |
| 9,815,383 B2 * | 11/2017 | Komiyama | B60L 11/1862 |

(Continued)

OTHER PUBLICATIONS

Sorin et al., "A Primer on memory Consistency and Cache Coherence," Copyright 2011, Morgan & Claypool Publishers, Editor Mark D. Hill, University of Wisconsin, pp. 1-16.

*Primary Examiner* — Phallaka Kik
(74) *Attorney, Agent, or Firm* — Mark H. Whittenberger, Esq.; Holland & Knight LLP (57) ABSTRACT

The present disclosure relates to a system and method for maintaining coherency in the memory subsystem of an electronic system modeled in dual abstractions. Embodiments may include providing a mixed abstraction simulation model including an abstract portion and a detailed portion, wherein the detailed portion includes a cache coherent interconnect and a coherency proxy. Embodiments may further include establishing, within the detailed portion, communication between an extended smart memory function and at least one of the cache coherent interconnect and the coherency proxy. Embodiments may also include determining, via the extended smart memory function, a status of at least one cache memory associated with the mixed abstraction simulation model. Embodiments may further include automatically maintaining, via the extended smart memory function, a coherent view of a system memory for the abstract portion and the detailed portion of the mixed abstraction simulation model.

17 Claims, 6 Drawing Sheets

(56) References Cited

U.S. PATENT DOCUMENTS

| | | | |
|---|---|---|---|
| 9,867,575 B2* | 1/2018 | Maani | A61B 5/721 |
| 2005/0088148 A1* | 4/2005 | Kubo | G01R 31/3679 |
| | | | 320/137 |
| 2006/0066285 A1* | 3/2006 | Minamiura | G01R 31/3662 |
| | | | 320/132 |
| 2010/0000809 A1* | 1/2010 | Nishi | B60K 6/445 |
| | | | 180/65.29 |
| 2010/0001693 A1* | 1/2010 | Iida | G01R 31/3679 |
| | | | 320/134 |
| 2010/0156356 A1* | 6/2010 | Asakura | H01M 10/44 |
| | | | 320/148 |
| 2012/0013304 A1* | 1/2012 | Murase | B60L 11/1864 |
| | | | 320/116 |
| 2012/0025613 A1* | 2/2012 | Morita | B60L 3/00 |
| | | | 307/64 |
| 2012/0049804 A1* | 3/2012 | Kobayashi | H01M 10/441 |
| | | | 320/150 |
| 2012/0256569 A1* | 10/2012 | Kawahara | H01M 10/486 |
| | | | 318/139 |
| 2013/0088201 A1* | 4/2013 | Iwasawa | G01R 31/3679 |
| | | | 320/118 |
| 2014/0097676 A1* | 4/2014 | Kusumi | H02J 7/045 |
| | | | 307/10.1 |
| 2014/0176085 A1* | 6/2014 | Maruno | G01R 31/3679 |
| | | | 320/162 |
| 2014/0200755 A1* | 7/2014 | Sisk | B60L 11/12 |
| | | | 701/22 |
| 2014/0320144 A1* | 10/2014 | Nakaya | H01M 10/54 |
| | | | 324/434 |
| 2014/0353055 A1* | 12/2014 | Kronfeld | B60L 11/007 |
| | | | 180/65.31 |
| 2015/0293182 A1* | 10/2015 | Tajima | H02J 7/00 |
| | | | 701/22 |
| 2015/0349387 A1* | 12/2015 | Inaba | H01M 10/44 |
| | | | 700/297 |
| 2015/0357852 A1* | 12/2015 | Nakao | G01R 31/3624 |
| | | | 320/162 |
| 2017/0129361 A1* | 5/2017 | Scaringe | B60L 11/1861 |
| 2018/0003855 A1* | 1/2018 | Aloe | A61B 5/681 |

\* cited by examiner

In some embodiments, a computer-readable storage medium having stored thereon instructions that, when executed, result in one or more operations for maintaining coherency in the memory subsystem of an electronic system modeled in dual abstractions is provided. Operations may include providing a mixed abstraction simulation model including an abstract portion and a detailed portion, wherein the detailed portion includes a cache coherent interconnect and a coherency proxy. Operations may further include establishing, within the detailed portion, communication between an extended smart memory function and at least one of the cache coherent interconnect and the coherency proxy. Operations may also include determining, via the extended smart memory function, a status of at least one cache memory associated with the mixed abstraction simulation model. Operations may further include automatically maintaining, via the extended smart memory function, a coherent view of a system memory for the abstract portion and the detailed portion of the mixed abstraction simulation model.

One or more of the following features may be included. In some embodiments, the system memory may be accessed without using a bus-interface connector. Operations may include determining whether a memory region is shared based upon, at least in part, analyzing one or more access patterns. In some embodiments, the abstract portion may be a SystemC abstraction. The detailed portion may be a register transfer level portion. In some embodiments, the extended smart memory function of the detailed portion may be configured to communicate with a second extended smart memory function associated with the abstract portion. The coherency proxy may be configured to receive read requests and write requests from the extended smart memory function.

In one or more embodiments of the present disclosure, a system may include a computing device having at least one processor configured to receive a mixed abstraction simulation model including an abstract portion and a detailed portion, wherein the detailed portion includes a cache coherent interconnect and a coherency proxy. The at least one processor may be configured to establish, within the detailed portion, communication between an extended smart memory function and at least one of the cache coherent interconnect and the coherency proxy. The at least one processor may be further configured to determine, via the extended smart memory function, a status of at least one cache memory associated with the mixed abstraction simulation model. The at least one processor may be further configured to automatically maintain, via the extended smart memory function, a coherent view of a system memory for the abstract portion and the detailed portion of the mixed abstraction simulation model.

One or more of the following features may be included. In some embodiments, the system memory may be accessed without using a bus-interface connector. The at least one processor may be configured to determine whether a memory region is shared based upon, at least in part, analyzing one or more access patterns. In some embodiments, the abstract portion may be a SystemC abstraction. The detailed portion may be a register transfer level portion. In some embodiments, the extended smart memory function of the detailed portion may be configured to communicate with a second extended smart memory function associated with the abstract portion. The coherency proxy may be configured to receive read requests and write requests from the extended smart memory function.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Typical functional verification systems, including hardware emulation systems and simulation acceleration systems, utilize interconnected programmable logic chips or interconnected processor chips. Examples of systems using programmable logic devices are disclosed in, for example, U.S. Pat. No. 5,109,353 entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," and U.S. Pat. No. 6,051,030 entitled "Emulation module having planar array organization." U.S. Pat. Nos. 6,618,698, 5,551,013, 6,035,117, and 6,051,030 are incorporated herein by reference.

Additional information regarding systems and methods for maintaining cache coherency of memory modeled in dual abstractions is described in U.S. Pat. Nos. 8,793,628 and 8,943,449, which are each available from the Assignee of the present disclosure and are each incorporated by reference herein in their entirety.

Figure 1:
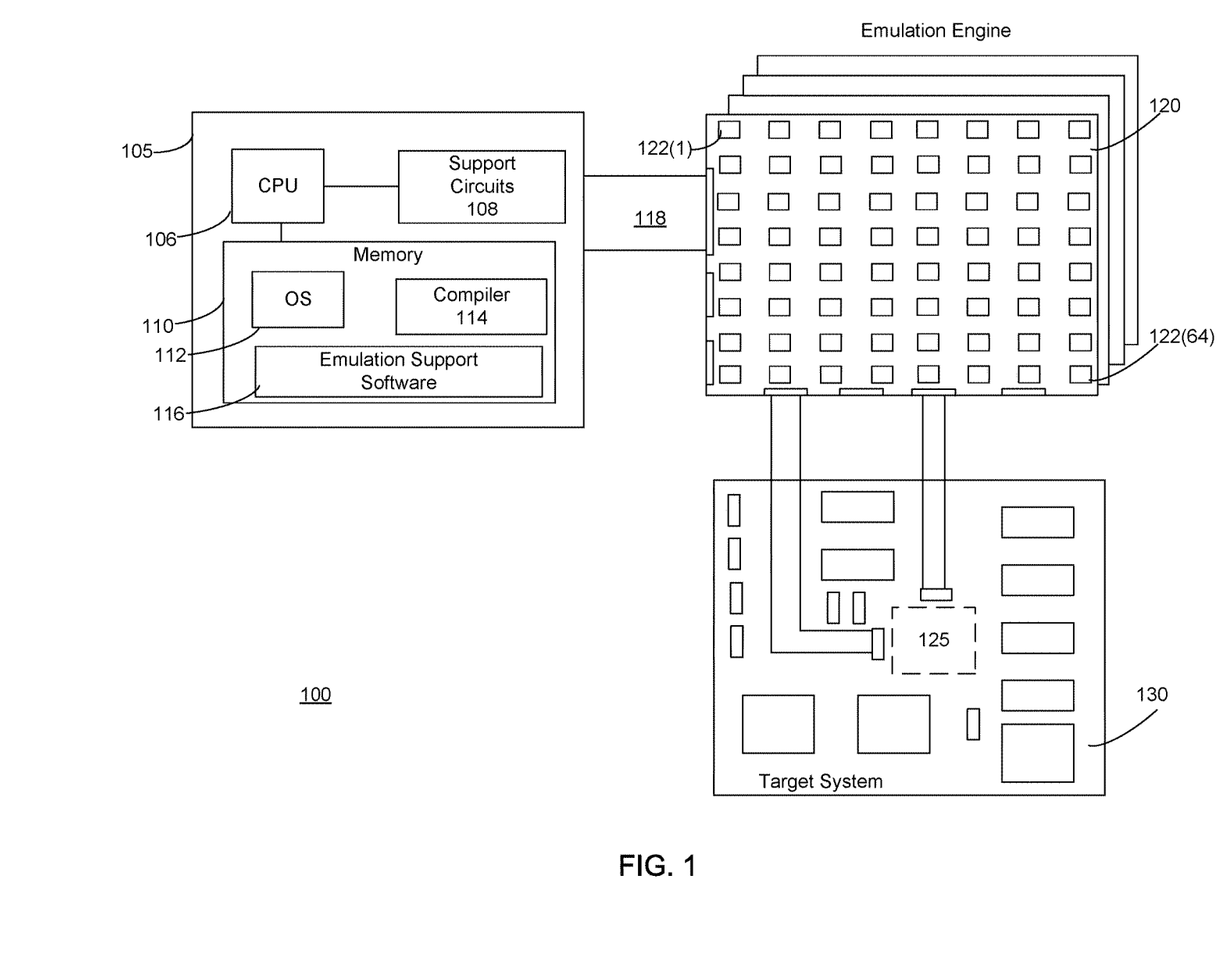
FIG. 1 is a system diagram depicting a processor based hardware emulation system in accordance with an embodiment of the present disclosure.

FIG. 1 illustrate an overview of a processor-based emulation system 100. The system comprises a host or computer workstation 105, an emulation engine including emulation board 120, and a target system 130.

The host workstation 105 provides emulation support facilities to the emulation engine 100 and emulation board 120. The host workstation 105, for example a personal computer, comprises at least one central processing unit (CPU) 106, support circuits 108, and a memory 110. The CPU 106 may comprise one or more conventionally available microprocessors and/or microcontrollers. The support circuits 108 are well known circuits that are used to support the operation of the CPU 106. These supporting circuits comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 stores various forms of software and files for the emulation system, such as an operating system (OS) 112, a compiler 114, and emulation support software 116.

The compiler 114 converts a hardware design, such as hardware described in VHDL, Verilog, etc., to a sequence of instructions that can be evaluated by the emulation board 120.

The host workstation 105 allows a user to interface with the emulation engine 100 via communications channel 118, including emulation board 120, and control the emulation process and collect emulation results for analysis. Under control of the host workstation 105, programming information and data is loaded to the emulation engine 100. The emulation board 120 has on it a number of individual emulation chips, for example the 64 emulation chips 1221 to 12264 (collectively 122) shown in FIG. 1, in addition to miscellaneous support circuitry.

In response to programming received from the emulation support software 116, emulation engine 100 emulates a portion 125 of the target system 130. Portion 125 of the target system 130 may be an integrated circuit, a memory, a processor, or any other object or device that may be emulated in a programming language. Exemplary emulation programming languages include Verilog, VHDL, and/or any other suitable language.

Figure 2:
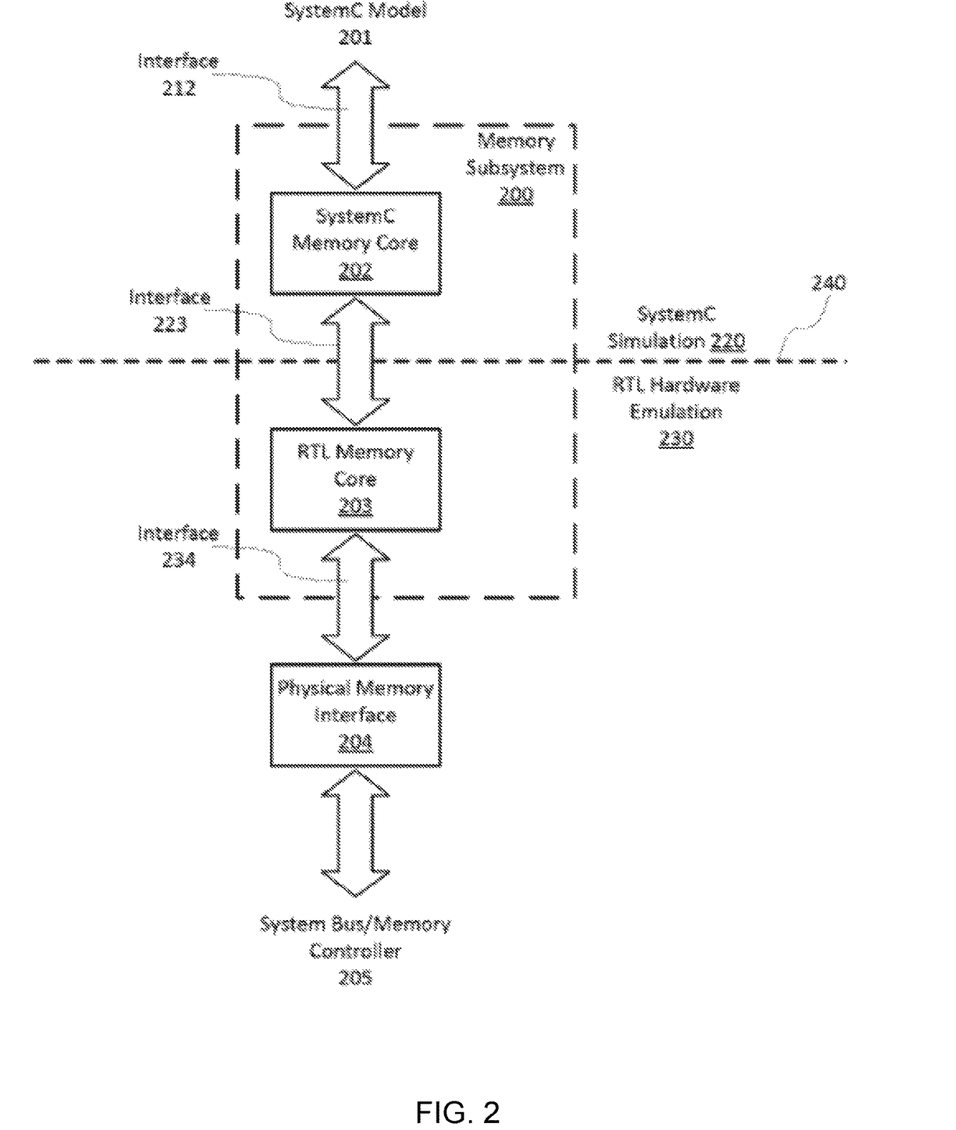
FIG. 2 is an illustration depicting a memory subsystem that may allow for execution in either SystemC simulation or an RTL simulation in accordance with an embodiment of the present disclosure.

FIG. 2 illustrates, according to an embodiment, a system for maintaining coherency in the memory subsystem 200 of a SoC modeled in two abstractions, a first for C/SystemC simulation and a second for RTL or gate-level emulation. The memory subsystem 200 is part of the overall system memory. Depending on the design of the SOC, memory subsystem 200 can comprise the entirety of the system memory. Divide 240 separates the two memory abstractions' images into a C/SystemC simulation side 220 and a RTL hardware emulation side 230. On the C/SystemC simulation side 220, the C/SystemC memory core 202 has an interface 212 with SystemC Model 201. Interface 212 can be for example a transaction-level model interface, such as SystemC TLM2, or a DMI, or both. On the RTL hardware emulation side 230, the RTL memory core 203 has a generic interface 234 with physical memory interface 204, which is in communication with the system bus/memory controller 205.

The SystemC memory core 202 and RTL memory core 203 are images of the same memory; shared memory block 200 has both a SystemC model of memory as well as a shadow RTL memory. In other embodiments, the memory block can have a RTL model of memory as well as a shadow SystemC memory. Shared memory block 200 may be used for a hybrid virtual SystemC-plus-RTL model, where a particular section of system memory map is used exclusively for communication back and forth between CPU in the SystemC virtual environment and an RTL block. Shared memory block 200 minimizes this need for cross-abstraction access by maintaining memory in one abstraction and the shadow memory in the other abstraction and implementing a method of coherency from either perspective through software modeling and emulation (direct memory access to RTL memory blocks in emulator) techniques. Shared memory block 200, and consequently SystemC memory core 202 and RTL memory core 203, is divided into pages. The sizes of the pages can be determined based on the application using the memory space. This minimizes the need for synchronization while maximizing the usage of memory transfer bandwidth.

The memory subsystem space is part of the overall system memory, and can be accessed using TLM2 transactions, and can be accessed using DMI. Where the memory space is a subset of the overall system memory space, the memory subsystem is able to be allocated into a particular portion of the CPU memory space. Allocation involves both size and address allocation, through a flexible memory map configuration. The memory subsystem 200 provides a RTL shadow memory model for a desired CPU and interconnect bus architecture in RTL. Such bus architectures include an Advanced eXtensible Interface™. (AXI™), AXI Coherency Extensions' (ACE™), or a double data-rate type three (DDR3) interface. Whichever of these bus architectures is used, RTL memory core 203 is bus architecture independent and can support any particular RTL access protocol. The implementation of memory subsystem 200 does not require changes to the operating system, drivers, or the application of the user of the system.

According to another embodiment, the subsystem memory space may include the full system memory.

According to an embodiment, the memory subsystem can be operated in a time-synchronized co-simulation/emulation execution mode, where the SystemC and RTL abstractions maintain strict time wheel synchronization. Here, the emulation running the RTL and the simulator running SystemC are alternating to process models in either abstraction, and TLM2 transactions are used in the SystemC memory core since a TLM2 access in SystemC can decode read and write transactions. With an alternating process automatic coherency can be implemented, where the shared memory model itself can automatically ensure coherency.

A shared memory system with distributed caches requires handling of consistency and coherency. Consistency (e.g., a memory consistency model) may define shared memory correctness and provide rules about loads and stores (or memory reads and writes) and how they act upon memory. There are typically many correct paths of execution/ordering. There are many different consistency models, some of these may include, but are not limited to, sequential consistency, total store order (x86), weak consistency (ARM), etc. Coherence (e.g., cache coherence) is generally provided by a coherency protocol and is often required for supporting a consistency model, especially when multiple actors (e.g., multiple cores) have access to multiple copies of a datum (e.g., in multiple caches) and at least one access is a write. Cache coherence may seek to make the caches of a shared-memory system as functionally invisible as the caches in a single-core system and ensures that a programmer cannot determine whether and where a system has caches by analyzing the results of loads and stores.

System level coherency enables the sharing of memory by system components without the software requirement to perform software cache maintenance to maintain coherency between caches. Regions of memory are coherent if writes to the same memory location by two components are observable in the same order by all components. A system may be considered coherent when all masters are able to read the CORRECT data from any valid address at any time. Additional information regarding cache coherence and various protocols may be found in AMBA® AXI™ and ACE™ Protocol Specification AXI3™, AXI4™, and AXI4-Lite™ ACE and ACE-Lite™—ARM IHI 0022E (ID022613)—ARM as well as in "A Primer on Memory Consistency and Cache Coherence"—Daniel J. Sorin, Mark D. Hill, David A. Wood—Editor Mark D. Hill, University of Wisconsin—Morgan & Claypool Publishers.

As used herein, an "observer" may refer to a master in the system that is capable of observing memory accesses. For a PE, the following mechanisms may be treated as independent observers: a mechanism that performs reads or writes to memory, a mechanism that causes an instruction cache to be filled from memory or that fetches instructions to be executed directly from memory. These are treated as reads. A mechanism that performs translation table walks may also be considered an independent observer. These are treated as reads.

As used herein, the term "observe" may include one or more of the following concepts for all memory. A write to a location in memory is said to be observed by an observer when a subsequent read of the location by the same observer returns the value written by the observed write, or written by a write to that location by any observer that is sequenced in the Coherence order of the location after the observed write. A write to a location in memory is also said to be observed by an observer when a subsequent write of the location by the same observer is sequenced in the Coherence order of the location after the observed write. A write to a location in memory is said to be globally observed for a shareability domain or set of observers when a subsequent read of the location by any observer in that shareability domain returns the value written by the globally observed write, or written by a write to that location by any observer that is sequenced in the Coherence order of the location after the globally observed write. A write to a location in memory is also said to be globally observed for a shareability domain or set of observers when a subsequent write of the location by any observer in that shareability domain is sequenced in the Coherence order of the location after the globally observed write. A read of a location in memory is said to be observed by an observer when a subsequent write to the location by the same observer has no effect on the value returned by the read. A read of a location in memory is said to be globally observed for a shareability domain when a subsequent write to the location by any observer in that shareability domain has no effect on the value returned by the read.

Figure 3:
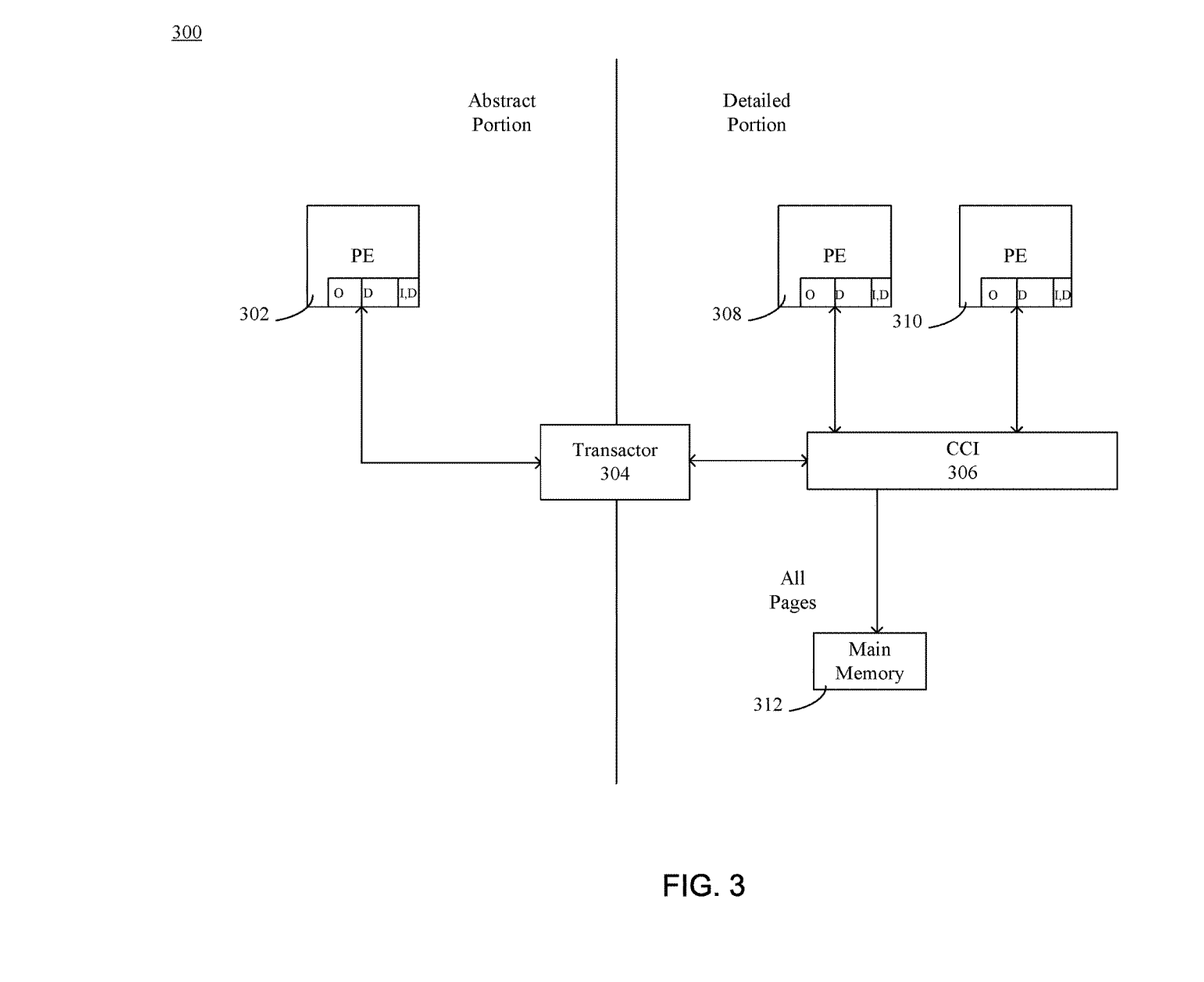
FIG. 3 is a schematic depicting aspects of the cache coherency process in accordance with an embodiment of the present disclosure.

Referring now to FIG. 3, an example block diagram 300 depicting one exemplary technique for enabling a coherent view of a memory system is provided. As is shown in FIG. 3, a number of processing elements (PEs) 302, 308, 310 are distributed across an abstract and a detailed portion. This particular example is configured to maintain the coherency protocol and caches on the abstract portion (master) (naive). It should be noted that this particular solution may include a cache model on the abstract portions and may be configured to deploy it in its correct place, e.g., close to the processor. The coherency protocol may be configured to run on both portions, the abstract and the detailed. In the example of FIG. 3, a bus interface transactor 304 between abstract and detailed parts is required which forwards coherency traffic correctly (bidirectional).

In this particular example, all system memory must be placed into the detailed portion so that accesses remain observable at all times. However, fast memory operations (e.g., DMI, in cases of SystemC) cannot be supported and there typically is a higher cost to communicate between abstraction islands (potentially distributed across different simulators). Moreover, a coherency protocol may generate large amounts of communication between participating masters. Accordingly, this may slow the models execution significantly (e.g., minutes vs days and weeks).

Figure 4:
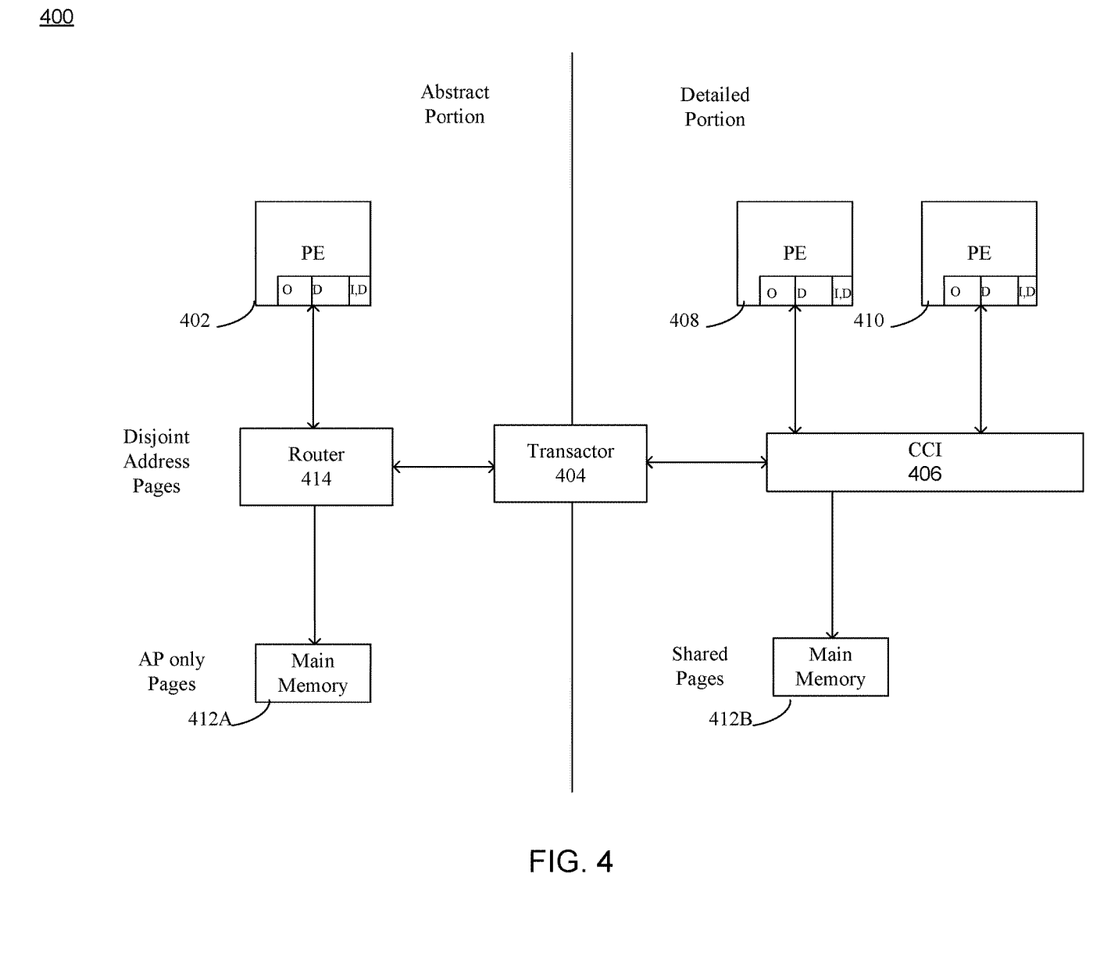
FIG. 4 is a schematic depicting aspects of the cache coherency process in accordance with an embodiment of the present disclosure.

Referring now to FIG. 4, an example block diagram 400 depicting one exemplary technique for enabling a coherent view of the memory system is provided. As is shown in FIG. 4, in this particular example only selected, statically configured, shared memory areas live in the detailed portion, the rest remains in the abstract portion. As such, if memory access patterns are known a priori in a partitioned system, those parts that are never accessed from the detailed partition may remain in the abstract partition, enabling abstraction from their accesses (e.g., using DMI, the direct memory interface in SystemC/TLM).

As shown in FIG. 4, this particular technique requires a router 414 that is configured to switch access between the detailed and abstract portions. Depending on the function of the cache model, the caching may be turned off statically for non-shared regions, could just request an access abstraction (DMI pointer), or a downstream element in the non-shared stream may have to terminate the coherency protocol correctly (if not ignorable, cf. TLM ignorable extensions). While this particular technique is expected to perform faster than that shown in FIG. 3, in the general case, a priori knowledge of the systems memory access and communication patterns is often impossible to obtain (application and use case specific) and its manual configuration in the systems router's and caches is cumbersome.

Figure 5:
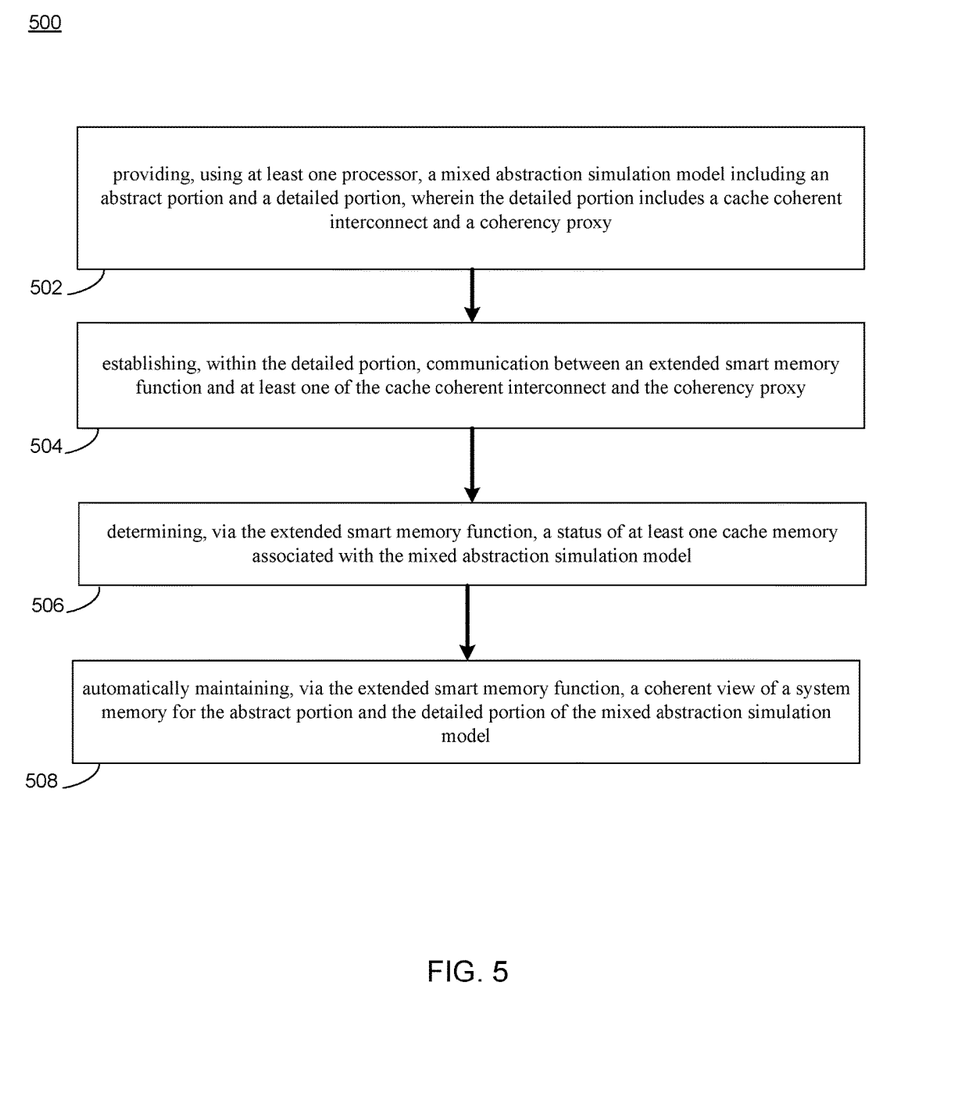
FIG. 5 is a flowchart depicting operations consistent with the cache coherency process of the present disclosure.
Figure 6:
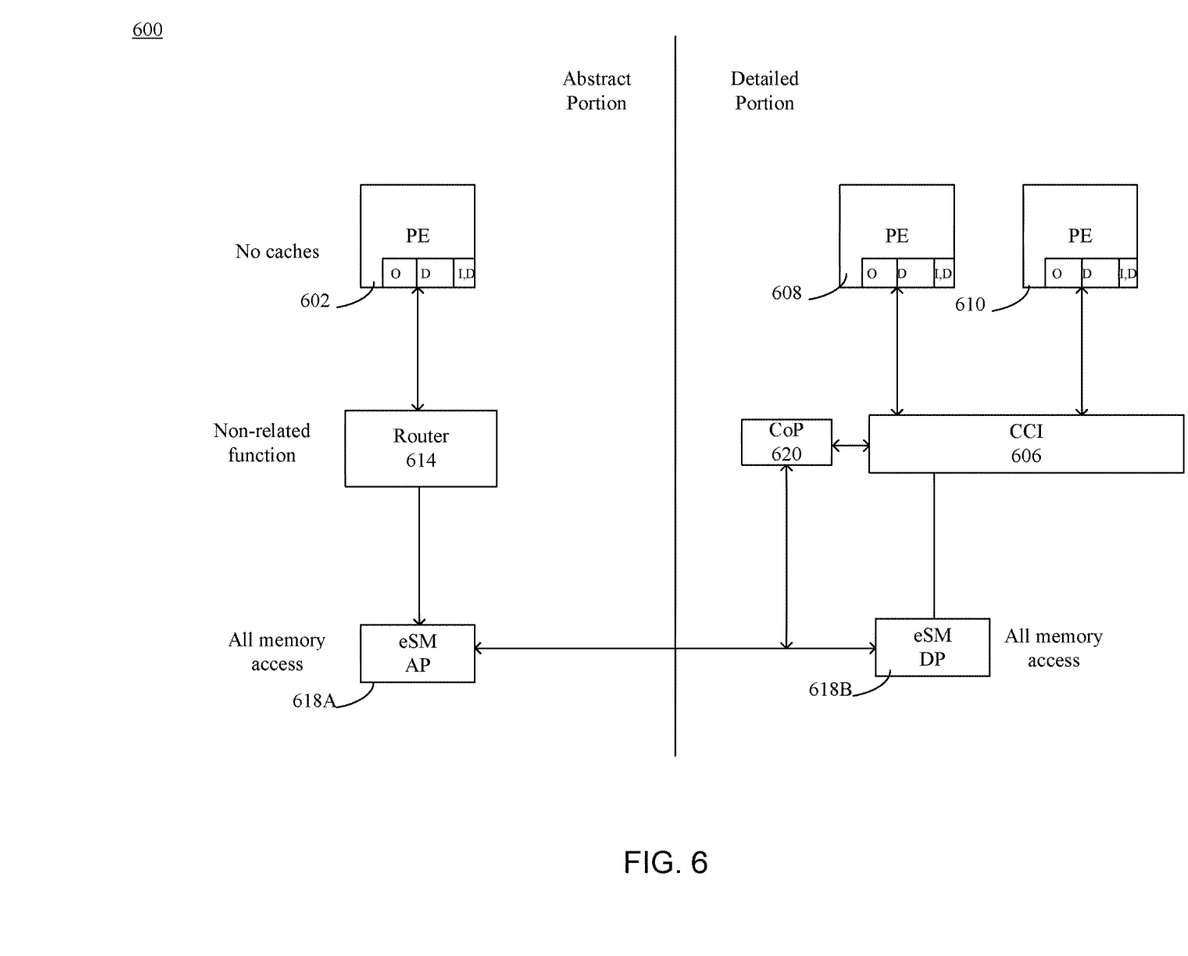
FIG. 6 is a schematic depicting aspects of the cache coherency process in accordance with an embodiment of the present disclosure.

In contrast, and referring now to FIGS. 5-6, embodiments of the cache coherency process described herein may be configured to confine the coherency protocol to the detailed portion of the simulation model. In some embodiments, this may include providing a Coherency Proxy (CoP) function 620 as a connector on the coherent master interface of the detailed fabric. Additionally and/or alternatively, cache coherency process may provide an extended SmartMemory (eSM) function 618 that takes into account the state of the caches in the system and automatically maintains coherent views of the shared system memory for both abstract 618A and detailed 618B portions. Embodiments of cache coherency process do not require a bus interface connector, not even a non-coherent one, as far as accesses to shared system memory are concerned.

Accordingly, embodiments of the cache coherency process described herein may dynamically learn whether memory regions are actually shared from the patterns of their accesses and may enable and/or re-enable access abstraction accordingly. In this way, a priori knowledge and static configuration of shared and abstract-only memory regions is not required. Embodiments of the cache coherency process may execute much faster than existing approaches as it limits the communication between the abstractions to the eSM's internal and highly bandwidth-optimized interfaces instead of relying on frequent bus transaction traversing the abstraction levels via a standard bus bridge with burst-wise access semantics for all data and coherency-protocol related traffic.

As shown in FIG. 5, embodiments of cache coherency process may include a system and method for maintaining coherency in the memory subsystem of an electronic system modeled in dual abstractions. Embodiments may include providing (502) a mixed abstraction simulation model including an abstract portion and a detailed portion, wherein the detailed portion includes a cache coherent interconnect and a coherency proxy. Embodiments may further include establishing (504), within the detailed portion, communication between an extended smart memory function and at least one of the cache coherent interconnect and the coherency proxy. Embodiments may also include determining (506), via the extended smart memory function, a status of at least one cache memory associated with the mixed abstraction simulation model. Embodiments may further include automatically maintaining (508), via the extended smart memory function, a coherent view of a system memory for the abstract portion and the detailed portion of the mixed abstraction simulation model.

As is depicted in FIG. 6, embodiments of cache coherency process may provide for termination and confinement of the coherent communication within an island or portion of detailed abstraction while maintaining a coherent view of the overall system memory for all parties involved. For example, this may mean that for a coherent interconnect fabric it remains in the detailed portion. Whether a memory (e.g., slave on coherent fabric) is located in the detailed or abstract portion is not necessarily relevant.

As discussed above, embodiments may include a coherency proxy (CoP) 620 on the detailed portion as well as an extended smart memory function (eSM) 618, each of which is discussed in further detail hereinbelow. The structural relation of these components is secondary and may follow ease-of-deployment considerations.

In some embodiments, the abstract portion (AP) may include one or more masters with cache functions disabled (abstracted), for example, no coherency protocol related traffic may be generated and no data that is shared with the detailed portion may be held in memories other than main memory. The main memory is the abstract part of a smart memory (AP SM) supporting dynamic determination of the shared property of the memory. DMI may be granted to the masters according to the conventional SM rules (e.g., those described in U.S. Pat. Nos. 8,793,628 and 8,943,449 referenced above). The term "main memory", as used herein, may represent any memory regions of the abstract masters' memory maps that are shared between the portions, in the sense that those regions are accessible from the masters in both parts. The main memory may be the point of coherency (PoC) for all participating masters. Whether that memory is centralized or distributed is not necessarily relevant. The latter potentially requires multiple instances of the SM, while the former only needs one.

In some embodiments, the detailed portion may include one or more masters that are in the same coherency domain. For example, they may have the same PoC as the abstract master(s), with enabled cache functions, coherency traffic is generated. The detailed portion may further include a CCI 606, to which the masters are connected. The CCI 606 may be configured to handle coherency protocol traffic. The detailed portion ("DP") may also include a detailed portion eSM function 618B. The DP eSM function 618B may be connected as slave to the CCI 606. Some or all of the accesses to DP eSM 618B are visible. The detailed portion may further include a CoP function 620, connected to the CCI 606 through the respective standard interface, and to the eSM via a proprietary interface (e.g. function call API).

In some embodiments, the coherency protocol may be configured to provide a means for connected masters to perform one or more operations. For example, each connected master may be configured to issue a READ request towards the CCI 606 for a cache line, resulting in a valid copy of the cache line marked as shared (state). This copy may be shared with other caches. Additionally and/or alternatively, each connected master may issue an INVALIDATE request towards the CCI 606, if the cache was marked shared, with the result that no other master has a copy of the data any more. Each connected master may also receive an INVALIDATE request, resulting in deletion of the local copy of a shared cache line. Otherwise, a write back of dirty data may be necessary. It should be noted that the latter may not happen in some of the examples provided below. Any existing coherency protocol may be expected to provide such set of primitives.

In some embodiments, the detailed portion of the eSM component may be extended over a conventional SM function (e.g., those described in U.S. Pat. Nos. 8,793,628 and 8,943,449 referenced above) such that read requests lead to dp_is_mrup=1 (e.g., page dirty on DP side), as all reads may entail modification of the data in a private cache.

In some embodiments, when the abstract portion requests updates on a dirty page (e.g., dp_is_mrup=1) the transfer operation may first forward READs to the CoP function for the respective address range. If applicable, the CoP 620 may return read data which may be updated in DP eSM's 618B memory. Then, the normal page update operation may resume, potentially removing the dirty flag (e.g., dp_is_mrup=0). It should be noted that the granularity of the read requests (e.g., address ranges) between eSM 618 and CoP 620 may not be relevant, as long as a complete page is read eventually. When the abstract portion notifies that a page is written (e.g., ap_is_mrup=1), logic forwards WRITEs for the respective address range to the CoP 620. If CoP 620 signals a dp_is_mrup=1 for a cache line, dp_is_mrup=1 is set and forwarded to the abstract portion.

In some embodiments, the abstract portion of the eSM component 618A may be extended over a conventional SM such that there can only be atomic changes to a shared page's state. When the abstract portion writes, for example, the page may be marked dirty first and this information may be forwarded to the detailed portion and acknowledged before the operation actually proceeds.

In some embodiments, the CoP 620 may include the ability to perform numerous functions, which are discussed in further detail hereinbelow. If a READ request is received from the eSM, and the CoP 620 does have a valid copy of that data (e.g., indicated by an 'shared' state for the cache line in question), no action is necessary, because that data is already correct in the eSM. If a READ request is received form the eSM 618, and the CoP 620 does not have a valid copy, a regular, sharable READ is issued on the cache-coherent interconnect. The received data is returned to the eSM 618, and the COP 620 sets its internal S flag. If a WRITE request is received from the eSM 618, and the CoP 620 has a "S" for the cache line in question, the CoP 620 issues an INVALIDATE on all other copies of the data. An evict message may be sent to signal to the snoop filter that the data is not present any more in any cache, as would be the case after a write-back. If an INVALIDATE request is received over the regular interconnect interface, CoP 620 signals to the eSM 618 that the corresponding cache line is now dp_is_mrup=1. The "S" is removed from the internal state. All other requests received from the CCI 606 are ignored.

While this realization provides a fully coherent view of the system, it still suffers from a pessimistic view of potentially modified detailed portion pages on pages that are unmodified but lost their shared property within the CoP 620. For example, if a page that was shared between detailed portion and the abstract portion has entered the ap_is_mrup==dp_is_mrup==0 state, and is subsequently being read only from the abstract portion, no further interaction is required. The CoP 620 has this page marked as 'shared'. However, in some coherent system implementations, the shared property may be deleted by reception of INVALIDATEs not issued for pending writes. That may be because, e.g., a snoop filter with limited capacity may choose to force out that line from the system. As long as the CoP 620 has no means to identify the cause of the INVALIDATE, a modification desire must be assumed and the dp_is_mrup flag has to be set. This results in the abstract portion to having request the page again explicitly, even though the detailed portion does not actually use that page.

Additionally and/or alternatively, in some cases there may be unknown presence of modified page data in private caches in the detailed portion. For example, a page is marked dirty by the eSM 618 upon read access via the regular DP memory interface because that copy of the data may be modified in a private cache. This results in explicit requests via the CoP 620 when the abstract portion wants to access the page, ensuring that a coherent version of the data is available (setting the shared property in the process). However, the page that was read initially may not be present in any of the other caches any more, which may lead to a false positive.

Accordingly, embodiments of the present disclosure may provide a second set of realizations (e.g., dynamic share with CoP 620 and coherency monitoring) that may use additional knowledge about the system state to address aforementioned shortcomings providing the ability to detect both INVALIDATE requests because of non-modifying reasons (e.g., the snoop filter) as well as whether a page is present in one (exclusive) or more than one (shared) peer cache. In some embodiments, this may be achieved using an interconnect with a modified snoop filter function. The snoop filter function may be extended to actually report on pages present in the system, using this information, the CoP function 620 may determine when to issue requests and modify mrup and shared states. Additionally and/or alternatively, an augmented CoP 620 may be used that is configured to determine the system state by listening to the complete coherency traffic. This requires snoop filtering to be turned off, at least for the CoP 620, essentially moving the needed snoop filter function (system monitoring and reporting) into the augmented CoP 620.

It should be noted that embodiments of the present disclosure may using any suitable processor models and/or coherency protocols. For example, specific realizations of embodiments included herein may be built with an ARM FM processor model (e.g., A57) in SystemC/TLM (abstract model), its CCI-500 as RTL component together with a coherent RTL master such an A53 cluster (RTL) and the components of the solution (CoP, eSM), implemented in RTL and SystemC. The supported coherency protocol could be MOESI. These examples are included merely by way of example as numerous other configurations and types may be employed without departing from the scope of the present disclosure.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
providing, using at least one processor, a mixed abstraction simulation model including an abstract portion and a detailed portion, wherein the detailed portion includes a cache coherent interconnect and a coherency proxy;
establishing, within the detailed portion, and using the at least one processor, communication between an extended smart memory function and at least one of the cache coherent interconnect and the coherency proxy;
determining, via the extended smart memory function, and using the at least one processor, a status of at least one cache memory associated with the mixed abstraction simulation model;
automatically maintaining, via the extended smart memory function, and using the at least one processor, a coherent view of a system memory for the abstract portion and the detailed portion of the mixed abstraction simulation model; and
determining, using the at least one processor, whether a memory region is shared based upon, at least in part, analyzing one or more access patterns to enable or re-enable access to the mixed abstraction simulation model.

2. The computer-implemented method of claim 1, wherein the system memory is accessed without using a bus-interface connector.

3. The computer-implemented method of claim 1, wherein the abstract portion is a SystemC abstraction.

4. The computer-implemented method of claim 1, wherein the detailed portion is a register transfer level portion.

5. The computer-implemented method of claim 1, wherein the extended smart memory function of the detailed portion is configured to communicate with a second extended smart memory function associated with the abstract portion.

6. The computer-implemented method of claim 1, wherein the coherency proxy is configured to receive read requests and write requests from the extended smart memory function.

7. A non-transitory computer-readable storage medium having stored thereon instructions that when executed by a machine result in the following operations:
providing, using at least one processor, a mixed abstraction simulation model including an abstract portion and a detailed portion, wherein the detailed portion includes a cache coherent interconnect and a coherency proxy;
establishing, within the detailed portion, communication between an extended smart memory function and at least one of the cache coherent interconnect and the coherency proxy;
determining, via the extended smart memory function, a status of at least one cache memory associated with the mixed abstraction simulation model;
automatically maintaining, via the extended smart memory function, a coherent view of a system memory for the abstract portion and the detailed portion of the mixed abstraction simulation model; and
determining whether a memory region is shared based upon, at least in part, analyzing one or more access patterns to enable or re-enable access to the mixed abstraction simulation model.

8. The computer-readable storage medium of claim 7, wherein the system memory is accessed without using a bus-interface connector.

9. The computer-readable storage medium of claim 7, wherein the abstract portion is a SystemC abstraction.

10. The computer-readable storage medium of claim 7, wherein the detailed portion is a register transfer level portion.

11. The computer-readable storage medium of claim 7, wherein the extended smart memory function of the detailed portion is configured to communicate with a second extended smart memory function associated with the abstract portion.

12. The computer-readable storage medium of claim 7, wherein the coherency proxy is configured to receive read requests and write requests from the extended smart memory function.

13. A system comprising:
a computing device having at least one processor configured to receive a mixed abstraction simulation model including an abstract portion and a detailed portion, wherein the detailed portion includes a cache coherent interconnect and a coherency proxy, the at least one processor configured to establish, within the detailed portion, communication between an extended smart memory function and at least one of the cache coherent interconnect and the coherency proxy, the at least one processor further configured to determine, via the extended smart memory function, a status of at least one cache memory associated with the mixed abstraction simulation model, the at least one processor further configured to automatically maintain, via the extended smart memory function, a coherent view of a system memory for the abstract portion and the detailed portion of the mixed abstraction simulation mode, the at least one processor further configured to determine whether a memory region is shared based upon, at least in part, analyzing one or more access patterns to enable or re-enable access to the mixed abstraction simulation model.

14. The system of claim 13, wherein the system memory is accessed without using a bus-interface connector.

15. The system of claim 13, wherein the abstract portion is a SystemC abstraction.

16. The system of claim 13, wherein the detailed portion is a register transfer level portion.

17. The system of claim 13, wherein the extended smart memory function of the detailed portion is configured to communicate with a second extended smart memory function associated with the abstract portion.

* * * * *